United States Patent
Cady et al.

(10) Patent No.: US 10,289,762 B2
(45) Date of Patent: May 14, 2019

(54) INTERCONNECTION NETWORK SIMULATOR AND METHOD FOR SIMULATING INTERCONNECTION NETWORKS

(71) Applicant: BULL SAS, Les Clayes Sous Bois (FR)

(72) Inventors: Alain Cady, Limours en Hurepoix (FR); Ben Bratu, Versailles (FR)

(73) Assignee: BULL SAS, Les Clayes Sous Bois (FR)

( * ) Notice: Subject to any disclaimer, the term of this patent is extended or adjusted under 35 U.S.C. 154(b) by 515 days.

(21) Appl. No.: 14/735,525

(22) Filed: Jun. 10, 2015

(65) Prior Publication Data

US 2015/0356215 A1     Dec. 10, 2015

(30) Foreign Application Priority Data

Jun. 10, 2014  (FR) ..................... 14 55261

(51) Int. Cl.
G06F 17/50   (2006.01)
H04L 12/24   (2006.01)

(52) U.S. Cl.
CPC .......... G06F 17/5009 (2013.01); H04L 41/12 (2013.01); H04L 41/145 (2013.01); H04L 41/0213 (2013.01); H04L 41/22 (2013.01); H04L 41/32 (2013.01)

(58) Field of Classification Search
CPC ... G06F 17/5009; H04L 41/12; H04L 41/145; H04L 41/0213; H04L 41/22; H04L 41/32
USPC ........................................................ 703/21
See application file for complete search history.

(56) References Cited

U.S. PATENT DOCUMENTS

| | | | |
|---|---|---|---|
| 6,134,516 A * | 10/2000 | Wang | G06F 17/5022 703/20 |
| 7,225,117 B1 | 5/2007 | Feldstein et al. | |
| 7,620,535 B2 * | 11/2009 | Shevenell | H04L 41/145 703/13 |
| 8,626,827 B1 | 1/2014 | Cabrera et al. | |
| 9,652,568 B1 * | 5/2017 | Tzelnic | G06F 17/5022 |
| 2003/0093252 A1* | 5/2003 | Frankel | G06F 11/261 703/13 |
| 2012/0158395 A1 | 6/2012 | Hughes et al. | |
| 2014/0046645 A1* | 2/2014 | White | G06F 17/509 703/13 |

OTHER PUBLICATIONS

Sethi, A. S. & Hnatyshin, V. Y. The Practical OPNET User Guide for Computer Network Simulation. CRC Press, 2013. p. 110-111. ISBN: 9781439812051.*

Andras Varga et. al., An Overview of the OMNeT++ Simulation Environment, SIMUTools, Mar. 3-7, 2008, Marseille, France, pp. 1-10. (Year: 2008).*

(Continued)

*Primary Examiner* — Aniss Chad
*Assistant Examiner* — Justin C Mikowski
(74) *Attorney, Agent, or Firm* — Pillsbury Winthrop Shaw Pittman LLP (57) ABSTRACT

An interconnection network simulator of computational nodes includes in particular a topology simulation module constructed and arranged to select and start a defined number of simulated modules, establish connection links between the started simulated modules so as to form a simulated interconnection network, and enable a user to interact with the started simulated modules.

11 Claims, 3 Drawing Sheets

(56) References Cited

OTHER PUBLICATIONS

Wolfgang E. Denzel, et. al., A Framework for End-to-End Simulation of High-performance Computing Systems, Simulation, vol. 86, Issue 5-6, May-Jun. 2010 331-350. (Year: 2010).*
Robert Sauter et. al., TinyLTS: Efficient Network-Wide Logging and Tracing System for TinyOS, IEEE INFOCOM 2011, 2033-2041 (Year: 2011).*
Gary Grider et. al., Parallel Log Structured File System (PLFS), Los Alamos National Laboratory Associate Directorate for Theory, Simulation, and Computation (ADTSC) LA-UR 13-20839, 2013, 82-83 (Year: 2013).*
Catello Di Martino, Assessing Time Coalescence Techniques for the Analysis of Supercomputer Logs, IEEE, 2012, 1-12 (Year: 2012).*
Uri Lublin et. al., The workload onparallel supercomputers: modeling the characteristics of rigid jobs, J. Parallel Distrib. Comput. 63 (2003) 1105-1122 (Year: 2003).*
Thomas J. Hacker et. al., An analysis of clustered failures on large supercomputing systems, J. Parallel Distrib. Comput. 69 (2009) 652-665 (Year: 2009).*
Preliminary Search Report as issued in French Patent Application No. 1455261, dated Mar. 13, 2015.

* cited by examiner

Prior Art

INTERCONNECTION NETWORK SIMULATOR AND METHOD FOR SIMULATING INTERCONNECTION NETWORKS

CROSS-REFERENCE TO RELATED APPLICATIONS

This application claims priority to French Patent Application No. 1455261, filed Jun. 10, 2014, the entire content of which is incorporated herein by reference in its entirety.

FIELD

The present invention relates, in the field of computer sciences, to interconnection network simulators enabling interconnection networks as well as software for managing such interconnection networks to be prototyped, developed and tested. The present invention also relates to a method for simulating interconnection networks. This invention is applicable to supercomputers that can include several thousands nodes.

BACKGROUND

Figure 1:
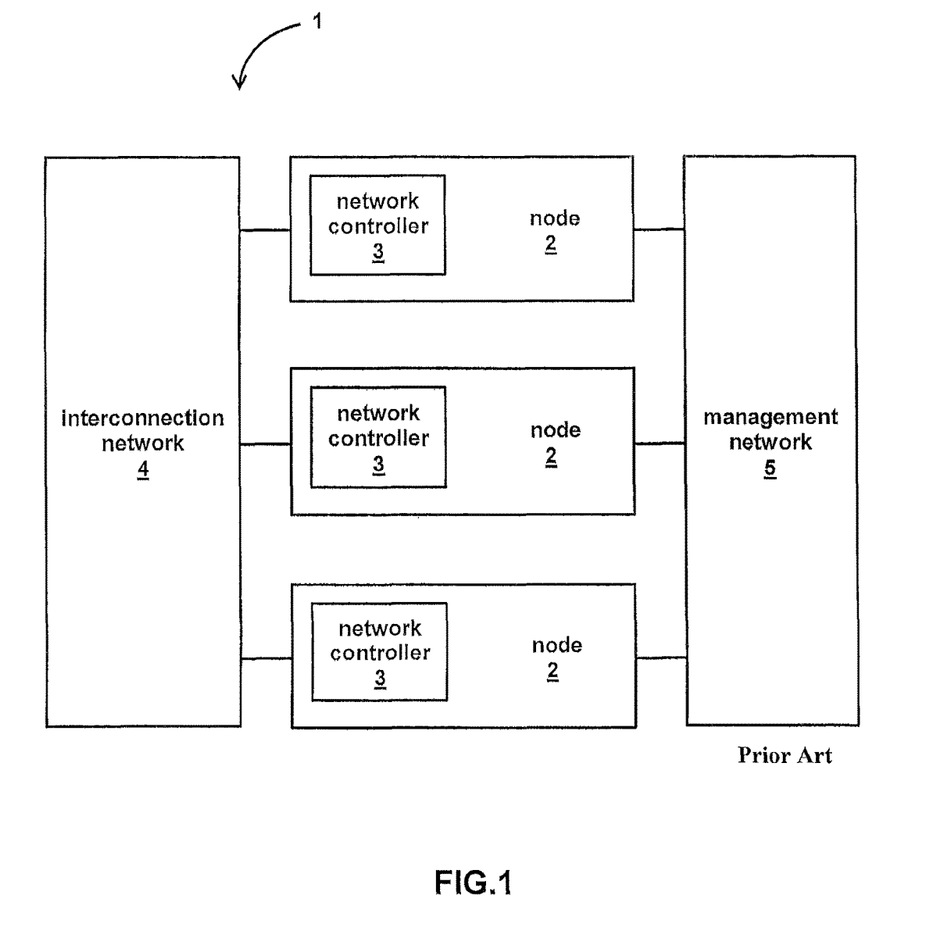
FIG. 1 illustrates an exemplary supercomputer in accordance with those of the state of the art, FIG. 2 schematically illustrates a non-limiting exemplary embodiment of an interconnection network simulator according to the invention.

In a known manner, supercomputers are formed by joining nodes each gathering several processors. These supercomputers consist in multiplying processors, so as to be able to simultaneously execute a great number of computations. As illustrated in FIG. 1, these supercomputers 1 known in prior art typically comprise several nodes 2 each comprising a network controller 3 and connected to each other by an interconnection network 4. Besides, a management network 5 interacts with the nodes 2 in order to configure them, monitor them and administer them.

The main function of an interconnecting network is to convey data between different nodes. Interconnection networks are thus a factor limiting the supercomputer performance, the performance of the supercomputer depending in particular on the communication latency and the pass-band. In other words, the performance of these supercomputers depends partly on the performance of the interconnection networks.

Because of the great number of connections, routers and nodes, the design of such interconnection networks is complex. In order to validate a design, it is known to use a simulator enabling different technological choices carried out during designing interconnection networks to be studied and validated.

Discrete event simulators such as ns-2, OMNeT++/OMNEST, SST, or even simGrid consider event sequences over time. However, they take no account of what happens in the time interval between two events. However, the behaviour between two events is often necessary for a large scale simulation. This implementation prohibits the use of an operating interface in real time, for example of the SNMP type. With these approaches, it is thus not necessary to simulate a high rate interconnection network in real time.

SUMMARY

An aspect of the invention is to overcome the drawbacks of the state of the art. Within this context, aspect of the present invention is to provide an interconnection network simulator enabling simulated interconnection networks to be prototyped, developed, and tested efficiently for (very) large scale supercomputers.

To that end, an embodiment of the invention relates to an interconnection network simulator of computational nodes, the interconnection network simulator including a topology simulation module constructed and arranged to:
- select and start a defined number of simulated modules,
- establish connection links between the started simulated modules so as to form a simulated interconnection network,
- enable a user to interact with said started simulated modules.

In the rest of the description, by started simulated module, it is meant a simulation method simulating a module for example of the switch type, or even of the network controller type.

Thanks to the topology simulation module, a user can interact with a simulated interconnection network so as to, for example, parameterizing at least one of the started simulated modules, define a communication scenario or even active or deactivate at least one of the started simulated modules or at least one of the connection links established. Thus, thanks to this topology simulation module, the simulated interconnection network is wholly parameterizable and modifiable so as to determine an interconnection network topology of a supercomputer including more than 32,000 nodes which is as efficient as possible.

The interconnection network simulator according to an embodiment of the invention can also have one or more of the characteristics hereinafter, considered singly or according to any technically feasible combinations.

In a non-limiting implementation, the started simulated modules are formed by a plurality of started simulated switch modules belonging to the interconnection network and a plurality of started simulated network controller modules belonging to the interconnection network.

In a non-limiting implementation, the started simulated modules are formed by a plurality started of simulated administration modules constructed and arranged to simulate interactions between the simulated interconnection network and a device for administering the simulated interconnection network.

In a non-limiting implementation, the topology simulation module is constructed and arranged to enable a user to interact with the started simulated modules by parameterizing at least one of the started simulated modules.

In a non-limiting implementation, the topology simulation module is adapted and built to enable a user to interact with the started simulated modules by activating or deactivating at least one of the started simulated modules.

In a non-limiting implementation, the topology simulation module is constructed and arranged to enable a user to interact with the started simulated modules by:
- assigning an identifier to each started simulated module, and
- generating, for each started simulated module, a local map describing the connection links established between the started simulated module and its surrounding started simulated modules.

In a non-limiting implementation, the topology simulation module is constructed and arranged to enable a user to interact with the started simulated modules by defining communication scenarios.

In a non-limiting implementation, at least one of the started simulated modules is constructed and arranged to generate simulation logs.

An embodiment of the invention also relates to a method for simulating an interconnection network of computational nodes, the method including:

selecting a defined number of simulated modules, the selection being made by a topology simulation module, starting the defined number of simulated modules, the starting being made by the topology simulation module, establishing connection links between the started simulated modules so as to form a simulated interconnection network, the establishing being made by the topology simulation module, a user interacting with the started simulated modules, the interaction being made via the topology simulation module.

In a non-limiting implementation, the interaction step includes a sub-step of parameterizing at least one of the started simulated modules.

In a non-limiting implementation, the interaction step includes a sub-step of defining at least one communication scenario.

In a non-limiting implementation, the interaction step includes a sub-step of activating or deactivating at least one started simulated module.

In a non-limiting implementation, the interaction step includes:
- a sub-step of assigning an identifier of each started simulated module, and
- a sub-step of generating, for each started simulated module, a local map describing the connection links established between said started simulated module and its surrounding simulated modules.

In a non-limiting implementation, the method for simulating an interconnection network according to an embodiment of the invention includes a step of generating a simulation log, the simulation log being generated by at least one of the started simulated modules.

BRIEF DESCRIPTION OF THE FIGURES

Further characteristics and benefits of the invention will appear clearly from the description thereof given herein below, by way of indicating and in no way limiting purposes, in reference to the appended figures, among which.

For the safe of clarity, only the elements useful for understanding the invention have been represented, and are shown schematically and without respecting the scale. Further, similar elements located on different figures bear identical references.

DETAILED DESCRIPTION

Figure 2:
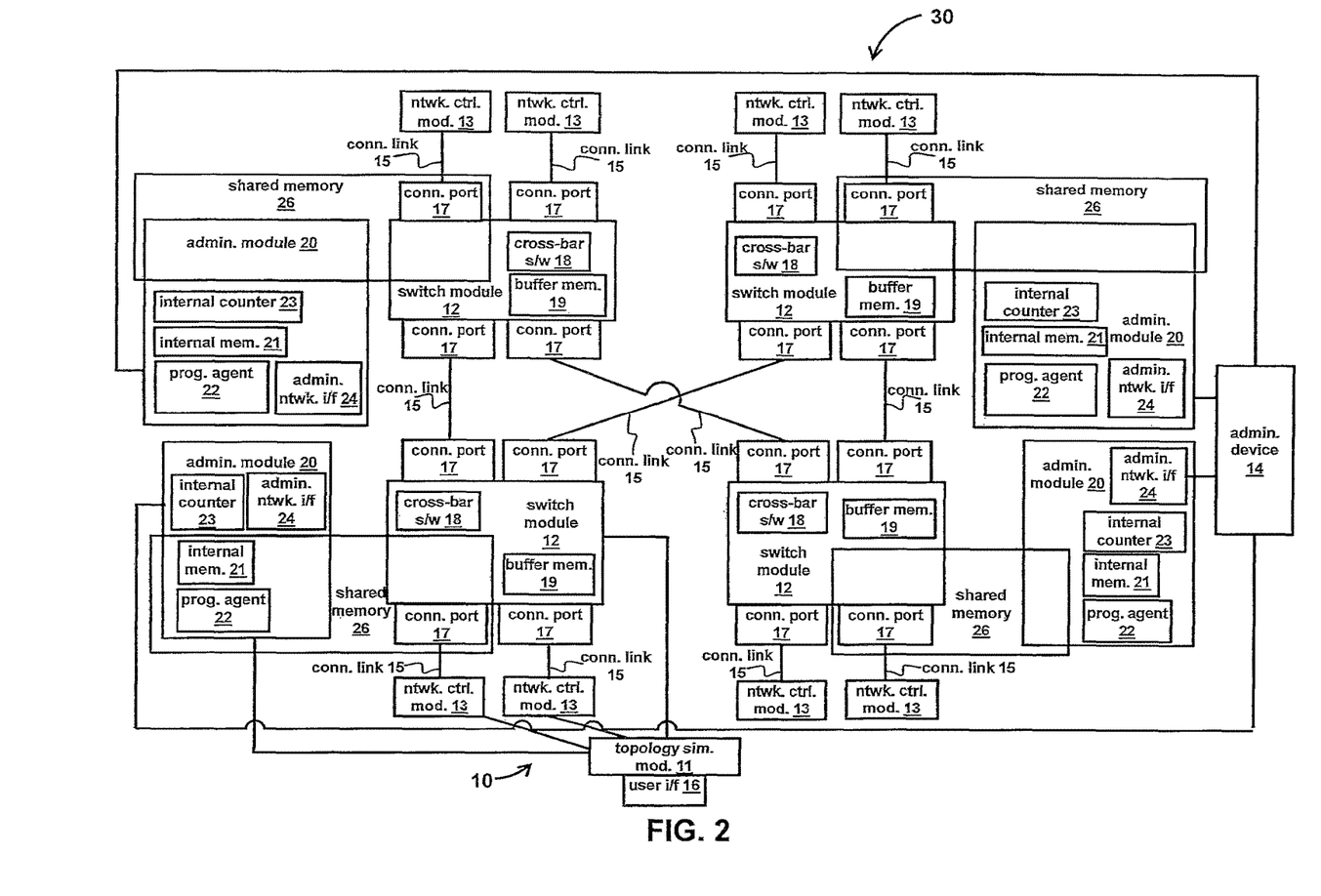

FIG. 2 illustrates in particular an interconnection network simulator 10 of computational nodes in accordance with an embodiment of the invention as well as a simulated interconnection network 30.

More particularly, the interconnection network simulator 10 of computational nodes according to an embodiment of the invention includes a topology simulation module 11 constructed and arranged to:

select and start a defined number of simulated modules, establish connection links between the started simulated modules so as to form a simulated interconnection network, enable a user to interact with the simulated modules.

In an implementation, the simulator, and more, particularly, the simulation module 11 can be implemented by way of, inter alia, one or more processors that is/are configured to execute computer executable instructions for carrying out or causing to carry out each of the above functions. In an embodiment, the computer executable instructions are stored in a memory.

More particularly, the started simulated modules by the topology simulation module 11 are formed in the example illustrated in FIG. 2 by:

four simulated switch modules 12, eight simulated network controller modules 13, four simulated administration modules 20, each of the simulated administration modules 20 being constructed and arranged to simulate interactions between the simulated interconnection network 30 and a simulated administration device 14 of the simulated interconnection network 30.

It should be noted that the started simulated switch modules 12 and the started simulated network controller modules 13 belong to the interconnection network 30. However, the started simulated administration modules 20 are at the interface between the simulated interconnection network 30 and the administration device 14. In other words, the started simulated administration modules 20 simulate interactions between the simulated interconnection network 30 and the administration device 14 of the simulated interconnection network 30.

Further, in the example illustrated, the simulated interconnection network 30 includes twelve simulated connection links 15.

For the sake of clarity, the number of started simulated modules which are represented in FIG. 2 is restricted.

Each simulated network controller module 13 is thus selected and started by the topology simulation module 11, wherein the topology simulation module can be implemented on a computer or processor. Generally, each started simulated network controller module 13 simulates a hardware type network interface enabling the nodes to exchange information.

It should be noted that the topology simulation module 11 is further constructed and arranged to enable a user to interact with the started simulated network controller modules 13 by defining communication scenarios. Computer executable instructions can be used to define the communication scenarios. Thus, a user can simulate, via a user interface 16 connected to the topology simulation module 11, a communication scenario by controlling transmissions and/or receptions of data according to a specific format. The user interface 16 can include hardware (e.g. a keyboard) and software components (instructions code) for enabling the user to define the communication scenarios. These data can, for example, be transmitted by the started simulated network controller modules 13 as data packets. A scenario can consist in cutting out a message as data packets, where each data packet has a reduced size, for example 20 octets, and where each data packet has a specific header.

Further, these communication scenarios can be used to test sequences and transmission frequencies of the started simulated network controller modules 13.

Generally, the communication scenarios tested enable technical choices carried out upon designing an interconnection network to be validated.

Further, the topology simulation module 11 is constructed and arranged to enable a user to interact with the started simulated modules by parameterizing at least one of the started simulated network controller modules 13. For example, parameterizing a started simulated network controller module 13 is performed via a C++-implemented MPI-type method. A method, using some functionalities of the MPI library, enables to force data transmission according to a determined connection link 15.

Generally and in a non-limiting way, the topology simulation module 11 associated with the started simulated network controller modules 13 allow to test:
- a number of iterations of data transmission,
- a time between two iterations of data transmission,
- sizes of the data transmitted and received by each started simulated network controller module 13,
- downlink and uplink data transmissions,
- modifications of an identifier of the started simulated network controller module 13,
- transmissions of acknowledgment of data received by each started simulated network controller module 13,
- transmissions of erroneous data, for example via the transmission of a corrupted data packet or even the loss thereof.

These started simulated network controller modules 13 parameterized via the topology simulation module 11 thus enable communication scenarios very close to real communications made through a real supercomputer provided with a high rate-type interconnection network to be simulated.

In a non-limiting implementation, each started simulated network controller module 13 is constructed and arranged to generate simulation logs. Thus, all of the test information can be transmitted by each started simulated network controller module 13 as a simulation log to the topology simulation module 11 to be aggregated, analysed and displayed on a viewing screen.

Besides, each simulated switch module 12 is selected and started by the topology simulation module 11. In the example illustrated, each started simulated switch module 12 includes switch sub-modules. More particularly, in the example illustrated, each started simulated switch module 12 simulates four connection ports 17, a cross-bar switch 18, and a buffer memory 19.

In a non-limiting implementation, the topology simulation module 11 is constructed and arranged to enable a user to interact with the started simulated modules by parameterizing at least one of the started simulated switch modules 12.

In a non-limiting implementation, the topology simulation module 11 is constructed and arranged to enable a user to interact with the started simulated modules by parameterizing at least one of the switch sub-modules 17, 18 and 19. Thus, it is possible to parameterize, via the topology simulation module, the number of connection ports 17, the arrangement of the cross-bar switches 18 and the capacity of the buffer memories 19. This parameterizing thus enables different hardware and software-type choices of an interconnection network to be simulated.

In a non-limiting implementation, the topology simulation module 11 is constructed and arranged to enable a user to interact with the started network controller modules 13 by defining communication scenarios. Upon implementing a communication scenario, each started simulated switch module 12 is independent and acts as a real switch module constructed and arranged to receive and transmit messages in the interconnection network in accordance with its routing tables and by taking the network traffic into account. More particularly, each started simulated switch module 12 is adapted to receive data from any module or device connected thereto and then transmitting data only to the module or device for which data are intended.

In a non-limiting example, each simulated switch module 12 is started via the topology simulation module 11 by means of an MPI-type independent method.

In a non-limiting example, the communication scenarios defined by means of the topology simulation module 11 enable:
- for each started simulated switch module 12, to simulate, for example, a modification of the identifier of the started simulated switch module 12 as soon as a new connection link 15 connected to the started simulated switch module 12 is created or removed,
- to simulate the behaviour of a switch module, for example when data are routed by a started simulated switch module 12 according to a predefined routing table,
- to simulate the behaviour of each of the sub-modules 17, 18, and 19.

Besides, the topology simulation module 11 is constructed and arranged to activate and deactivate each of the simulated switch modules 12 as well as the connection ports 17. This feature thus enables communication scenarios to be operationally checked. This feature is contemplatable because each started simulated switch module 12 is independent.

In a non-limiting implementation, the topology simulation module 11 is also constructed and arranged to select and start simulated administration modules 20. Generally, each started simulated administration module 20 is constructed and arranged to simulate interactions between a switch module 12 and an administration device 14.

In the example illustrated, each started simulated administration module 20 includes administration sub-modules. More particularly, each started simulated administration module 20 includes at least one internal memory 21, a programmable agent 22, internal counters and an administration network interface 24. This administration network interface 24 enables an external access for connecting the administration device 14 to be simulated.

In a non-limiting implementation, the topology simulation module 11 is constructed and arranged to enable the user to interact with the started simulated modules by parameterizing at least one of the started simulated administration modules 20.

In a non-limiting implementation, the topology simulation module 11 is constructed and arranged to enable a user to interact with the started simulated modules by parameterizing at least one of the administration sub-modules 21, 22, 23, and 24.

Each started simulated administration module 20 is parameterizable via the topology simulation module 11 so as to
- implement a MIB-type method reflecting an SNMP agent responsive to the orders of the administration device 14 (the administration device 14 corresponds to a software for administrating the interconnection network, also called Fabric management),
- directing the SNMPv3 type-requests transmitted by the administration device 14 to an administration module 20, where the requests can for example include an update of the routing table or even an update of the internal counters,
- simulate a CSR-type layer reflecting an hardware implementation in a shared memory 26, or
- allow driving and performance information transmission to the administration device 14 via an SNMP INFORM-type mechanism.

In a real implementation of an interconnection network, a communication protocol, for example of the JTAG-type, is implemented between a switch module and an administration module communicating with this switch module.

Within the scope of the invention, the interconnection network simulator 10 according to an embodiment of the invention is constructed and arranged to simulate this communication protocol between a started simulated switch module 12 and a started simulated administration module 20. For this, a same memory 26 is shared between a started simulated switch module 12 and a started simulated administration module 20. The communication protocol between a started simulated switch module 12 and a started simulated administration module 20 is not really implemented but is simulated by parameterizing:
- for the started simulated switch module 12, a first access time to the shared memory 26,
- for the started simulated administration module 20, a second access time to the shared memory 26.

Generally, the topology simulation module 11 is constructed and arranged to select and start a defined number of simulated modules, for example in the case illustrated in FIG. 2, four simulated switches, eight simulated network controller modules and four simulated administration modules.

Further, this topology simulation module 11 is constructed and arranged to distribute these started simulated modules on hardware resources. For this, it is possible to use a SLURM (Simple Linux Utility for Resource Management)-type solution.

Further, this topology simulation module 11 is constructed and arranged to establish connection links between the started simulated modules so as to form a simulated interconnection network.

Further, this topology simulation module 11 is constructed and arranged to enable a user to interact with all the started simulated modules and more particularly with the simulated interconnection network.

Further, this topology simulation module 11 is constructed and arranged to assign an identifier to each started simulated module. Each identifier can be formed by a number. From these assigned identifiers, the topology simulation module 11 can define a local map describing connection links established between a started simulated module of the interconnection network and its surrounding started simulated modules.

Generally, the topology simulation module 11 is an entry point allowing to directly interact with a simulated interconnection network. Thus, a user can, via this topology simulation module 11 that can for example be implemented on a computer, define communication scenarios, parameterize each started simulated module or even activate or deactivate some started simulated modules. For example, a user can thus via this topology simulation module 11:
- add and/or remove connection links between the started simulated modules,
- parameterize and/or add and/or remove and/or deactivate and/or activate started simulated switch modules,
- parameterize and/or add and/or remove and/or deactivate and/or activate started simulated administration modules,
- parameterize and/or add and/or remove and/or deactivate and/or activate sub-modules, for example connection ports,
- return to the initial topology,
- define, for each started simulated module, communication scenarios.

It should also be noted that each started simulated module can be constructed and arranged to generate simulation logs. Thus, when a communication scenario is defined and then implemented, each of the started simulated modules transmits simulation logs to the user interface 16 that can for example be formed by a screen. Hence, the user can analyse the simulation logs. A simulation log can for example indicate state changes of a started simulated module or even data that have passed through said module.

Figure 3:
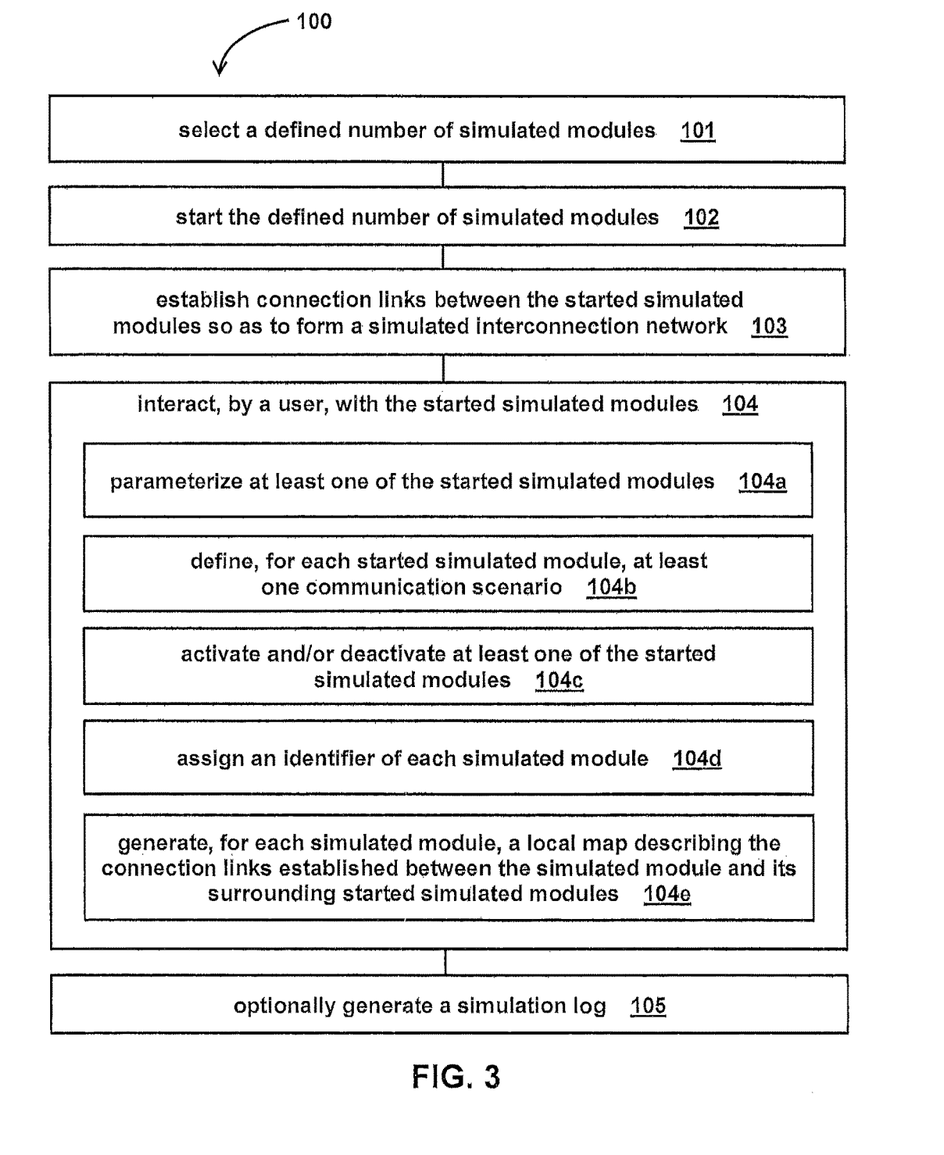
FIG. 3 illustrates a block diagram of the steps of a method for simulating an interconnection network according to an embodiment of the invention.

An embodiment of the invention also relates to a method for simulating an interconnection network 100 of computational nodes. The method 100 includes:
- selecting 101 a defined number of simulated modules 12, 13, 20, the selection being made by a topology simulation module 11,
- starting 102 the defined number of simulated modules 12, 13, 20, the starting 102 being made by the topology simulation module 11,
- establishing 103 connection links 15 between the started simulated modules 12, 13 so as to form a simulated interconnection network 30,
- a user interacting 104 with the started simulated modules 12, 13, 20, the interaction 104 being made via the topology simulation module 11.

The method 100 can also include an optional step of generating a simulation log 105. Each simulated module 12, 13, or 20 can thus generate a simulation log.

The interaction step 104 between a user and a simulated interconnection network can implement, in an isolated or combined way, the following sub-steps of:
- parameterizing 104a at least one of the started simulated modules 12, 13, 20,
- defining 104b, for each started simulated module 12, 13, 20, at least one communication scenario,
- activating and/or deactivating 104c at least one of the started simulated modules 12, 13, 20,
- assigning 104d an identifier of each simulated module 12, 13,
- generating 104e, for each simulated module 12, 13 a local map describing the connection links 15 established between the simulated module 12, 13 and its surrounding started simulated modules.

It should be noted that the steps of the method 100 represented in FIG. 3, the topology simulation module 11 as well as all the started simulated modules, for example, the switch modules 12, the network controller modules 13 or the administration modules 20 represented in FIG. 2 can be implemented in a single physical processor, or on a plurality of individual physical processors, some of which can be shared.

In an embodiment, the processor(s) is/are configured to execute machine or computer executable instructions for carrying out or causing to carry out the above method(s) and procedure(s), e.g. the function(s) of the simulation module and/or the different modules described above.

For example, execution of the sequences of machine instructions contained in a memory causes the processor(s) or processing unit(s) to perform at least some of the process steps or function(s) of the procedures described herein. One or more physical processors or physical processing units in a multi-processing arrangement may also be employed to execute the sequences of instructions contained in the memory or machine/computer readable medium. In alternative embodiments, hard-wired circuitry may be used in place of or in combination with software instructions.

The term "computer readable medium" or "machine readable medium" or "machine storage medium" or "memory"

as used herein refers to any medium that participates in providing instructions to a processor or processing unit for execution. Such a medium is non-transitory and may take many forms, including but not limited to, non-volatile media, volatile media, and transmission media. Non-volatile media include, for example, optical or magnetic disks. Volatile media include dynamic memory. Transmission media include coaxial cables, copper wire and fiber optics. Common forms of computer/machine readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer/machine readable media may be involved in carrying one or more sequences of one or more instructions to processor for execution.

Computer programs comprising machine executable instructions for implementing at least one of the steps of the method described herein or function(s) of various elements of the structural arrangement can be implemented by one or more computers or computing modules comprising at least an interface, a physical processor and a non-transitory memory (also broadly referred to as a non-transitory machine readable or storage medium). The computer is a special purpose computer as it is programmed to perform specific steps of the method(s) and the function(s) described above. The non-transitory memory is encoded or programmed with specific code instructions for carrying out the above method(s) and its/their associated steps. The non-transitory memory may be arranged in communication with the physical processor or processing units so that the physical processor, in use, reads and executes the specific code instructions embedded in the non-transitory memory. The interface of the special purpose computer may be arranged in communication with the physical processor and receives input parameters that are processed by the physical processor.

It will be appreciated by one skilled in the art that the disclosed arrangements and methods described herein represent a solution to the technological problem currently faced by designers for simulating interconnection networks.

The invention claimed is:

1. A system for simulating an interconnection network of computational nodes, comprising:
   one or more processors; and
   a computer readable medium having executable instructions stored thereon such that the one or more processors, in response to the executable instructions, are operative to:
     select and start at least 1,000 simulated modules;
     establish connection links between the started simulated modules so as to form a simulated interconnection network; and
     enable a user to interact with the started simulated modules so that, after the simulated modules are started, the user interacts with one or more of the started simulated modules so to (a) parameterize said one or more started simulated modules, or (b) define a communication scenario to the simulated interconnection network or (c) activate or deactivate the one or more of the started simulation modules or at least one of the established connection links, or any combination of (a)-(c),
   wherein, further to the interaction with the started simulated modules, each of the started simulated modules generates a simulation log.

2. The system according to claim 1, wherein the started simulated modules include a plurality of started simulated switch modules belonging to the interconnection network and a plurality of started simulated network controller modules belonging to said interconnection network.

3. The system according to claim 1, wherein the started simulated modules include a plurality of started simulated administration modules configured to simulate interconnections between the simulated interconnection network and an administration device of the simulated interconnection network.

4. The system according to claim 1, wherein the user parameterizes said one or more started simulated modules by determining parameters for the one or more started simulated modules.

5. The system according to claim 1, wherein the one or more processors are further operative to enable a user to interact with the started simulated modules by:
   assigning an identifier to each started simulated modules, and
   generating, for each started simulated module, a local map describing the connection links established between the started simulated modules and its surrounding started simulated modules.

6. A computer-implemented method for simulating an interconnection network of computational nodes, the method comprising:
   selecting, via one or more processors, at least 1,000 simulated modules, the selection being made by a topology simulation module;
   starting, via one or more processors, the selected simulated modules, the starting being made by the topology simulation module;
   establishing, via one or more processors, connection links between the started simulated modules so as to form a simulated interconnection network, the establishing being made by the topology simulation module, and
   user interacting with said started simulated modules, the interaction being made via the topology simulation module,
   wherein, after the selected simulated modules are started, the user interacts with one or more of the started simulated modules so to (a) parameterize said one or more started simulated modules, or (b) define a communication scenario to the simulated interconnection network or (c) activate or deactivate the one or more of the started simulation modules or at least one of the established connection links, or any combination of (a)-(c), and
   wherein, further to the interaction with the started simulated modules, each of the started simulated modules generates a simulation log.

7. The method for simulating an interconnection network according to claim 6, wherein the interaction includes determining parameters for the one or more of the started simulated modules.

8. The method for simulating an interconnection network according to claim 6, wherein the interaction includes:
   assigning an identifier of each started simulated module, and
   generating, for each started simulated module, a local map describing the connection links established between the started simulated module and its surrounding simulated modules.

9. The system according to claim 1, wherein the one or more processors are further operative to aggregate, analyze, and display on a viewing screen the generated simulation logs.

10. The system according to claim 1, wherein each of the generated simulation logs indicates state changes of the respective started simulated module.

11. The system according to claim 1, wherein each of the generated simulation logs indicates data that has passed through the respective started simulated module.

* * * * *